United States Patent [19]
Komura et al.

[11] Patent Number: 5,522,966
[45] Date of Patent: Jun. 4, 1996

[54] DRY ETCHING PROCESS FOR SEMICONDUCTOR

[75] Inventors: Atsushi Komura, Obu; Yoshikazu Sakano, Chita-gun; Kenji Kondo, Hoi-gun; Keiichi Kon, Aiko-gun; Tetsuhiko Sanbei, Narita; Shoji Miura, Anjo, all of Japan

[73] Assignee: Nippondenso Co., Ltd., Kariya, Japan

[21] Appl. No.: 152,895

[22] Filed: Nov. 17, 1993

[30] Foreign Application Priority Data

Nov. 18, 1992 [JP] Japan .................................. 4-333638

[51] Int. Cl.⁶ .................................................. H01L 21/00
[52] U.S. Cl. ................................ 156/662.1; 156/643.1; 156/646.1; 437/225
[58] Field of Search .................... 156/643, 646, 156/662, 653, 643.1, 646.1, 662.1, 653.1; 437/225

[56] References Cited

U.S. PATENT DOCUMENTS

| | | | |
|---|---|---|---|
| 4,208,241 | 6/1980 | Harshbarger et al. | 156/643 |
| 4,226,665 | 10/1980 | Mogab | 156/643 |
| 4,256,634 | 3/1981 | Levinstein et al. | 156/643 |
| 4,450,042 | 5/1984 | Purdes | 156/643 |
| 4,784,720 | 11/1988 | Douglas | 156/643 |
| 4,855,017 | 8/1989 | Douglas | 156/643 |

FOREIGN PATENT DOCUMENTS 04171813  6/1992  Japan .

*Primary Examiner*—R. Bruce Breneman
*Assistant Examiner*—George Goudrean
*Attorney, Agent, or Firm*—Cushman, Darby & Cushman

[57] ABSTRACT

A process for forming trenches on a surface of a semiconductor substrate by dry etching using a gas mixture. The gas mixture comprises; (1) an etchant gas comprising at least bromine which etches the semiconductor surface to form trenches, (2) a cleaning gas comprising a halogen which evaporates residue formed by the etching, and (3) a reactive gas, e.g. $N_2$, capable of reacting with material formed during the etching and capable of controlling the inclination of the trenches.

5 Claims, 5 Drawing Sheets

Fig.1A
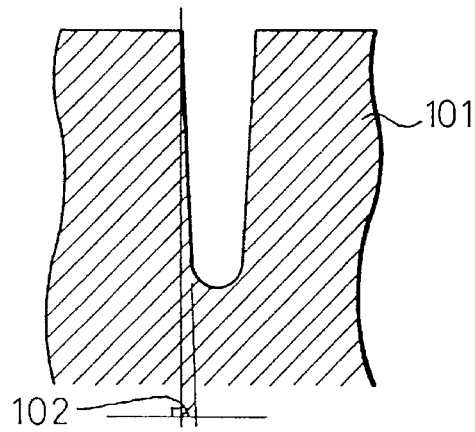
Fig.1B  Fig.1C  Fig.1D
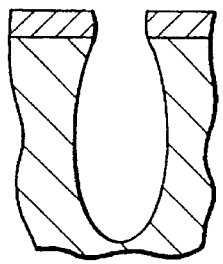 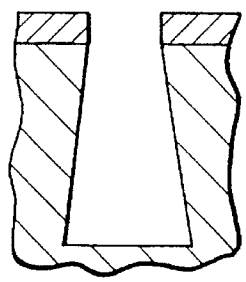 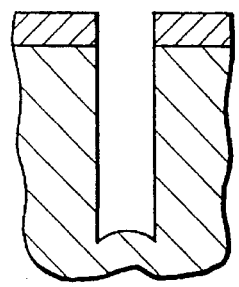
Fig.1E  Fig.1F  Fig.1G
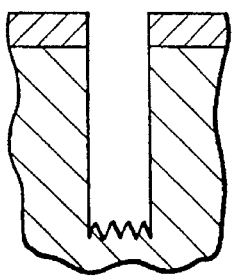 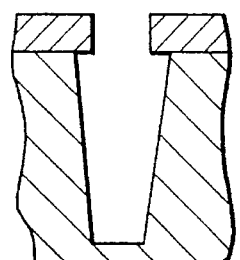 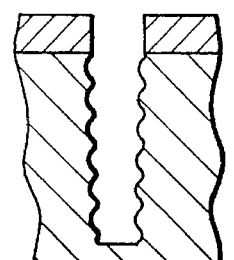
Fig.1H
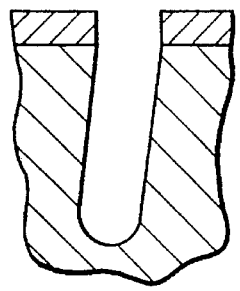

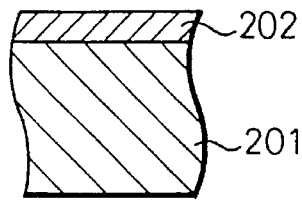
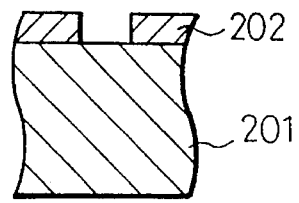
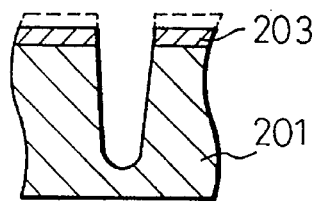
Fig. 2A    Fig. 2B    Fig. 2C
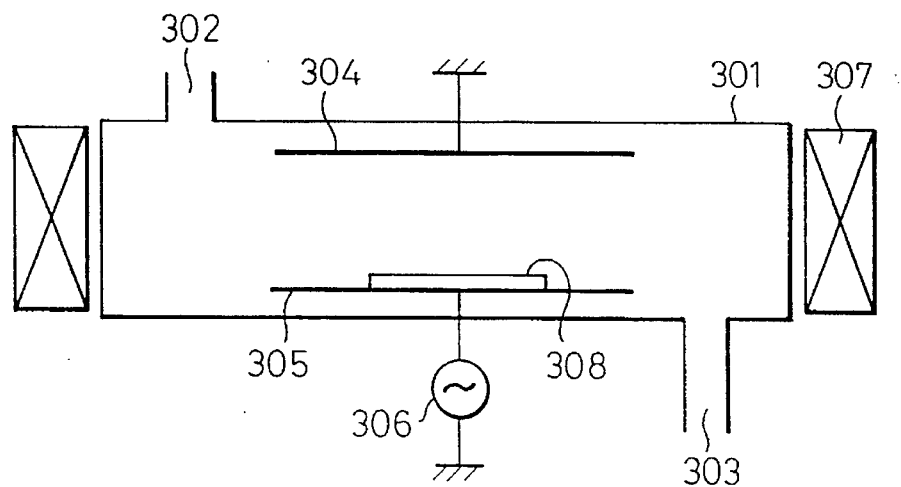
Fig. 3
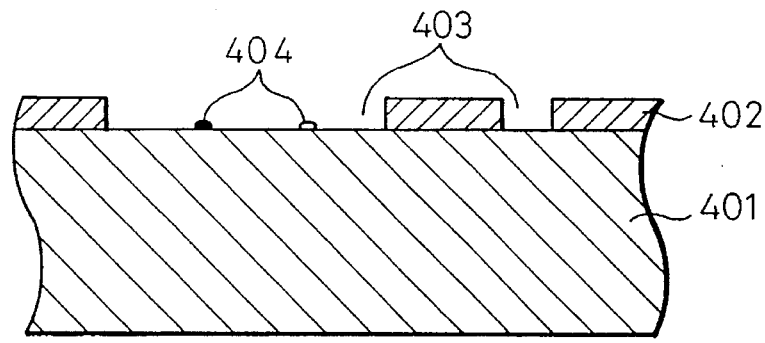
Fig. 4A
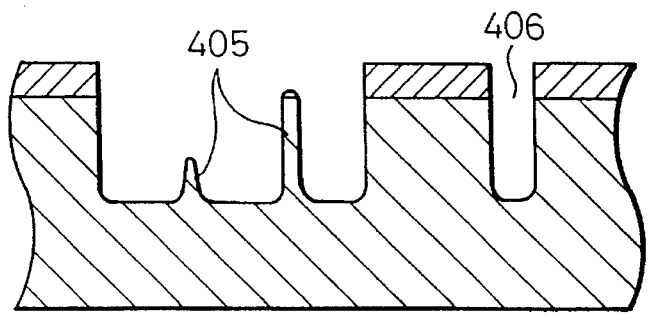
Fig. 4B 5,522,966

DRY ETCHING PROCESS FOR SEMICONDUCTOR

BACKGROUND OF THE INVENTION

1. Field of the Invention

This invention relates to a process of forming a trench or a deep hole by dry etching, in a semiconductor substrate, which is particularly useful for manufacturing an article made from Si, such as semiconductor DRAM device.

2. Description of the Related Art

Trenches formed by selectively digging down through a surface of a semiconductor are necessary to realize a high integration and high voltage withstanding properties in a semiconductor device. The configuration of each of the trenches must have a side wall which is a little inclined to form a taper, has a smooth surface, and has a round bottom as shown in FIG. 1A, from a view point of the manufacturing process and the characteristics of semiconductor devices. Thus, establishment of a technique for forming a trench having a good configuration is required. In FIG. 1A, 101 is silicon substrate and 102 is a side wall angle. Undesirable configurations are shown in FIG. 1B through FIG. 1H.

Heretofore, dry etching of Si for trenches (the same with deep holes, hereinafter only trenches being referred to) and others are conducted generally by using a fluorine-containing gas (hereinafter referred to as "F system gas"), a chlorine containing-gas (hereinafter referred to as "Cl system gas"), a bromine-containing gas (hereinafter referred to as "Br system gas"), etc., as disclosed in U.S. Pat. Nos. 4,226,665 and 4,208,241. Generally, forming a trench is conducted, as shown in FIG. 2A through FIG. 2C, by forming an insulating mask $SiO_2$ 202 over the Si substrate 201 (FIG. 1A), followed by forming a pattern in the mask, and then conduct etching. Here, a description of further processes for forming integrated circuits is eliminated.

At present, forming of trenches can be performed by an RIE (Reactive Ion Etching) device in an atmosphere of the Br system gas, F system gas, Cl system gas etc. However, a reliable and stable method as is applicable to commercial production is not yet known. Among the known processes, there is a report wherein the control of the side wall configuration of the trench can be attained by mixing etching gas $SiCl_4$ and an inert gas, and carrying out dry etching with the gas pressure thereof being controlled.

During forming of a trench, not only the Si substrate 201 is etched, but also the $SiO_2$ mask 202 is partially etched and becomes thin, as shown in FIG. 2C. The difficulty of mask diminishing is shown by "selectivity ratio against $SiO_2$". The selectivity ratio against $SiO_2$ is defined as a ratio of etching speed of semiconductor to etching speed of $SiO_2$. The larger the value thereof, the deeper the trench can be made. This is because at the place where the selectivity ratio against $SiO_2$ is small, the mask disappears before the trench is etched enough, and the Si of substrate which was under the $SiO_2$ is eroded. Therefore, an etching gas having a large selectivity ratio against $SiO_2$ is required. However, F system gas has generally low selectivity ratio against $SiO_2$, and has a problem that it tends to cause isotropic etching wherein an etching reaction proceeds in all directions.

Further, as semiconductor devices become various and highly efficient, inhibition of the formation of etching residue is required in the trench formation in order to raise the production yield. The mechanism of forming etching residue is shown in FIGS. 4A and 4B. On a bared portion of Si 403 in a mask pattern before etching as shown in FIG. 4A, dusts or particles 404 adhere, or fragments of mask or reaction products, formed during the etching, adhere. Thus normal etching is inhibited and finally projections 405 as shown in FIG. 4B are formed, which are called black Si or Si black, which causes problems of decrease of yield etc. Generally, F system gas, Cl system gas, and Br system gas, in this order, increase the amount of black Si. In the above order, the latter gives a more ordered side wall configuration.

Prior art, as disclosed in U.S. Pat. No. 4,450,042, provides a general process for etching Si perpendicularly. This process, however, gives trenches at most 5 μm deep, and if one tries to etch more deeply, one cannot necessarily form satisfactory trenches having stable configurations and high accuracy, because the configurations of trenches lack uniformity, or if uniform configurations are pursued, much residue is formed. In some cases a mixture of gases are used in order to take advantage of various etching gases. However an etching process is not yet proposed which solves all of the problems at the same time, to provide a commercial production system.

U.S. Pat. No. 4,784,720 discloses a process for controlling the trench configuration by selectively adhering reaction products onto the side walls of the trenches. However, the process of controlling the configuration by selectively adhering the etching reaction product is apt to produce etching residues. Since the residues, when they are left as they are, decrease yield, due to leakage and poor voltage breakdown properties, a further process is required to remove them. The patent also describes mixing $SiCl_4$ and an inert gas and that the side wall configurations of trenches can be controlled by the gas pressure. However, the patent does not describe the inert gas clearly or mention other gases.

SUMMARY OF THE INVENTION

An object of this invention is to solve the above problems and, at the same time, to provide a process to produce, efficiently and with high accuracy, desirable trenches with regular configuration and reproducibility.

This invention relates to a process for forming trenches on a surface of a semiconductor substrate by dry etching using a gas mixture, the gas mixture comprising an etchant gas comprising at least bromine (hereinafter referred to as "Br containing gas") which etches the semiconductor surface to form trenches, a cleaning gas comprising a halogen (hereinafter referred to as "X containing gas") which evaporates residue formed by said etching, and a reactive gas capable of reacting with a material formed during the etching and of controlling the inclination of the trenches. In this process, the flow rate of the reactive gas is controlled corresponding to an aimed trench configuration.

When etching is carried out with the above gas mixture, under appropriately set up values of parameters described in examples mentioned below, Br containing gas etches the semiconductor substrate, the X containing gas volatilizes and removes etching residues, and the reactive gas suppress the action of the Br containing gas and the X containing gas to prevent overetching and to control the configuration of trenches to provide the desired trenches.

As made apparent from the later-mentioned Examples and Comparative Examples, in accordance with this invention, the side wall angle of trenches is controlled by controlling flow rate of reactive gas ($N_2$ gas), without reducing the selectivity ratio against $SiO_2$. Further, this invention Sharply decreases the etching residue by the use of the X containing gas and also forms the desired trench configuration.

BRIEF DESCRIPTION OF THE DRAWINGS

FIG. 1A is a cross sectional view of an ideal configuration of a trench.

FIGS. 1B through 1H are cross sectional views of undesirable configurations of trenches.

FIGS. 2A through 2C are schematic cross sectional views representing a process of forming a trench.

FIG. 3 is a schematic structural cross sectional view of a magnetron RIE (Reactive Ion Etching) device used in Examples and Comparative Examples.

FIGS. 4A and 4B are cross sectional views showing a mechanism of creation of etching residue (black Si).

DETAILED DESCRIPTION OF THE INVENTION

Figure 5:
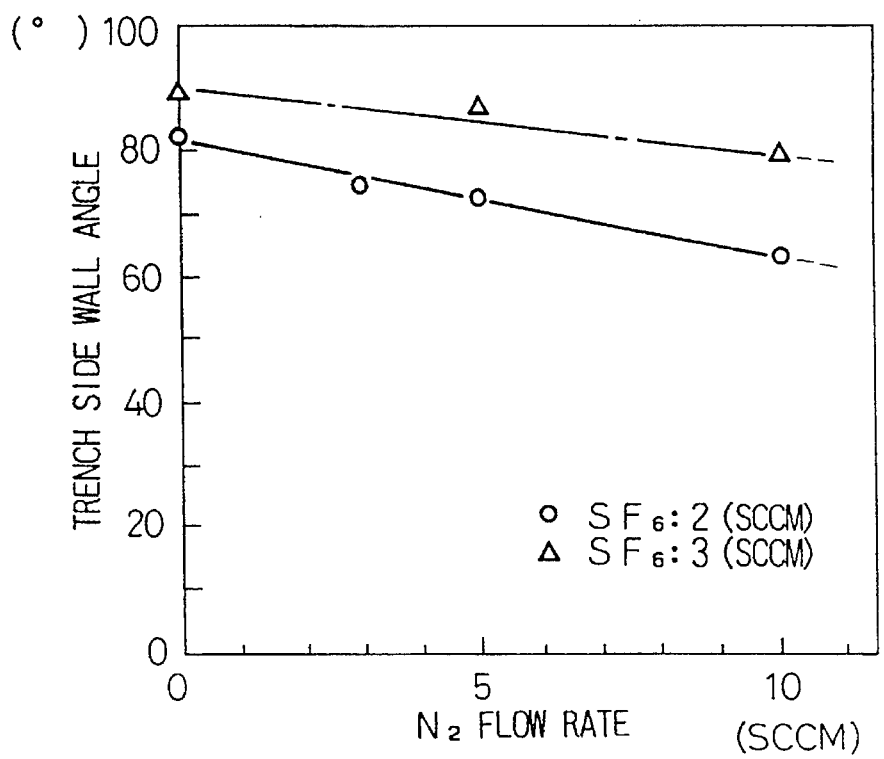
FIG. 5 is a diagram showing the dependency, on the $N_2$ flow rate, of the trench side wall angle of a sample used in an Example.

Examples of the semiconductor substrate of this invention are an Si single crystal wafer and an SOI (Si On Insulator) wafer.

Examples of the dry etching devices of this invention are RIE (Reactive Ion Etching), magnetron RIE, ECR (Electron Cyclotron Resonance) devices.

Examples of the etchant gas comprising at least bromine (Br containing gas) of this invention are a gas comprising at least one of HBr and $Br_2$.

Examples of the cleaning gas comprising a halogen (X containing gas) of this invention are a gas comprising at least one of $NF_3$, $CF_4$, $C_2F_6$, $Cl_2$ and $SF_6$.

An example of the reactive gas of this invention is a nitrogen containing gas (hereinafter referred to as "$N_2$ gas"). The $N_2$ gas may further contain an inert gas such as helium, argon, neon, xenon.

This invention will now be explained based on concrete embodiments.

As a dry etching device, an RIE (Reactive Ion Etching) device as shown in FIG. 3 was used. In FIG. 3, an etching chamber 301 is provided with upper electrode 304 and lower electrode 305, and an Si substrate 308 is placed on the lower electrode 305, an etching gas as mentioned below is introduced via the entrance 302 and exhausted from the gas exit 303. Between these electrodes, an electric power at 13.56 MHz is provided from a high frequency power source 306, gas plasma is generated between the electrodes, and etching of the Si substrate is carried out. This RIE device is provided with magnet coil 307 around the etching chamber, thus it is in a magnetron mode.

In the above RIE device, the etching gas used in the embodiments of this invention consists of HBr as Br containing gas, $SF_6$ as X containing gas, and $N_2$ gas. Further, the substrate temperature was 20° C.

Figure 6:
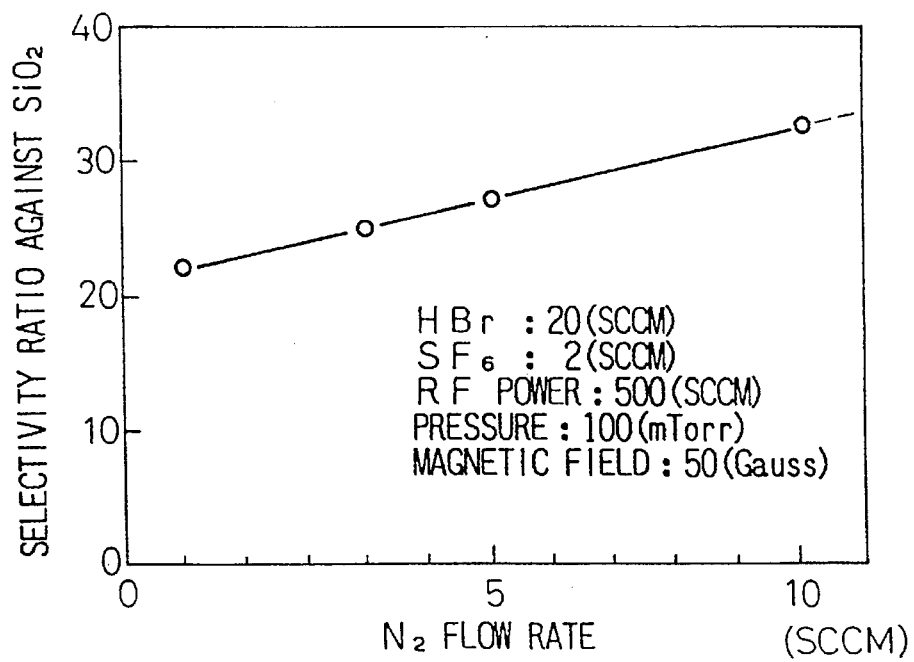
FIG. 6 is a diagram showing the dependency on $N_2$ flow rate, of the selectivity ratio against $SiO_2$ of a sample used in an Example.

Under the condition of an HBr flow rate of 20 SCCM (standard cubic centimeters per minute), an $SF_6$ flow rate of 2 and 3 SCCM, RIE device high frequency power of 500 W, mixed gas pressure of 100 mTorr, magnetic field strength of coil shown in FIG. 3 of 55 Gauss, and various $N_2$ gas flow rates, the Si substrate was etched. Thereafter, the trench side wall angle (102 of FIG. 1A) was determined. As shown in FIG. 5, the result shows that the side wall angle and the $N_2$ gas flow rate show a proportional relation in the vicinity of the perpendicular side wall angle, and the side wall angle can be set at a desired angle in the range of 60° C. to 90° C., by the flow rate of $N_2$ gas. Further, as shown in FIG. 6, the selectivity ratio of $SiO_2$ is also changed by the $N_2$ gas flow rate, and it becomes larger as the flow rate increases, which is advantageous for forming trenches.

The function of the $N_2$ gas is presumed to be as follows. During the etching, $N_2$ is decomposed to form N radicals in the plasma, which react in the gas phase with Si or etching products to form SiN, which covers the side wall, prevents the progress of excessive etching of the side wall, and controls the side wall angle. At the same time, it covers the $SiO_2$ mask to protect the $SiO_2$ mask from being etched, resulting in increasing the selectivity ratio against $SiO_2$.

Further, by adding the $N_2$ gas, the side wall surface was confirmed to become very smooth, which is effective to improve the reliability of the product produced by the process of this invention.

Figure 7:
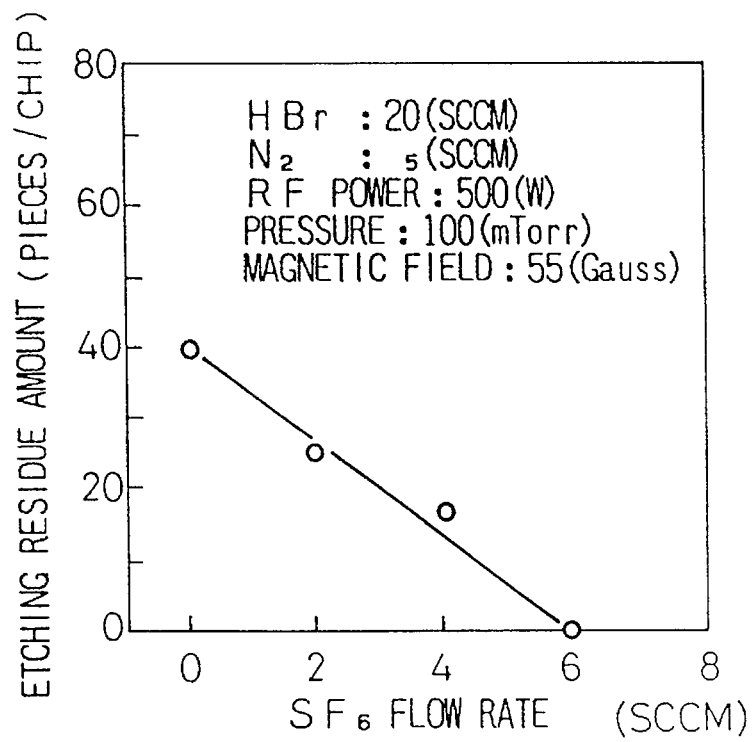
FIG. 7 is a diagram showing the dependency of the etching residue on the $SF_6$ flow rate.
Figure 8A:
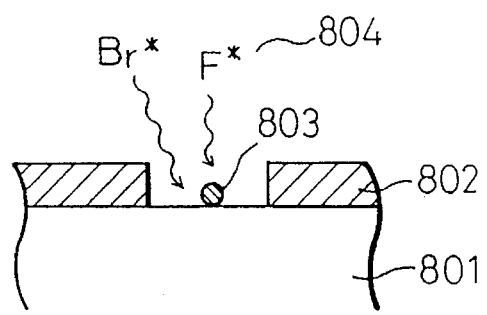
FIGS. 8A and 8B are cross sectional views showing the mechanism of decreasing etching residue by $SF_6$.
Figure 8B:
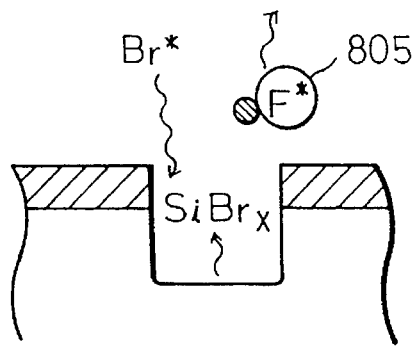

As shown in FIG. 7, it is apparent that, as flow rate of $SF_6$ increases, the amount of etching residue decreases, and it disappears at relatively low flow rate of $SF_6$. Here, the amount of etching residue is represented by the number of remaining pieces on a 1 cm square chip having pattern width of 10 μm. The mechanism of the disappearance of the etching residue is believed to be as follows. Although there is a small piece 803 that does not become etched on the Si substrate 801 as shown in FIG. 8A, $SF_6$ decomposes in the plasma to form an active F radical 804, which reacts with the small piece 803 and vaporize the piece (805). A result has been obtained that at a flow rate of $SF_6$ to attain no etching residue, the selectivity ratio against $SiO_2$ must have a relatively small value of 10, which is disadvantageous to deep trench formation. The depth of trench can be made optimum in relation to the amount of residue.

As for trench configuration, the bottom surface is required to be round for electric field and stress relaxation. Concerning this configuration, various examinations were carried out. As a result, under a wide range of conditions, as shown in the Table 1, good bottom configurations were confirmed to be obtainable.

TABLE 1

| Parameter | Set Value |
| --- | --- |
| HBr Flow Rate (SCCM) | 10–100 |
| $SF_6$ Flow Rate (SCCM) | 2–10 |
| $N_2$ Flow Rate (SCCM) | 3–10 |
| High Frequency Power (W) | 200–600 |
| Gas Pressure (mTorr) | 50–150 |
| Magnetic Field Strength (Gauss) | 0–100 |

Further, the $N_2$ flow rate is confirmed to be effective in the range from 0 SCCM to 30 SCCM. Also, the etching rate is confirmed to be level enough for practical use at about 800 nm/min (refer to Table 3, Example 1).

Figure 9:
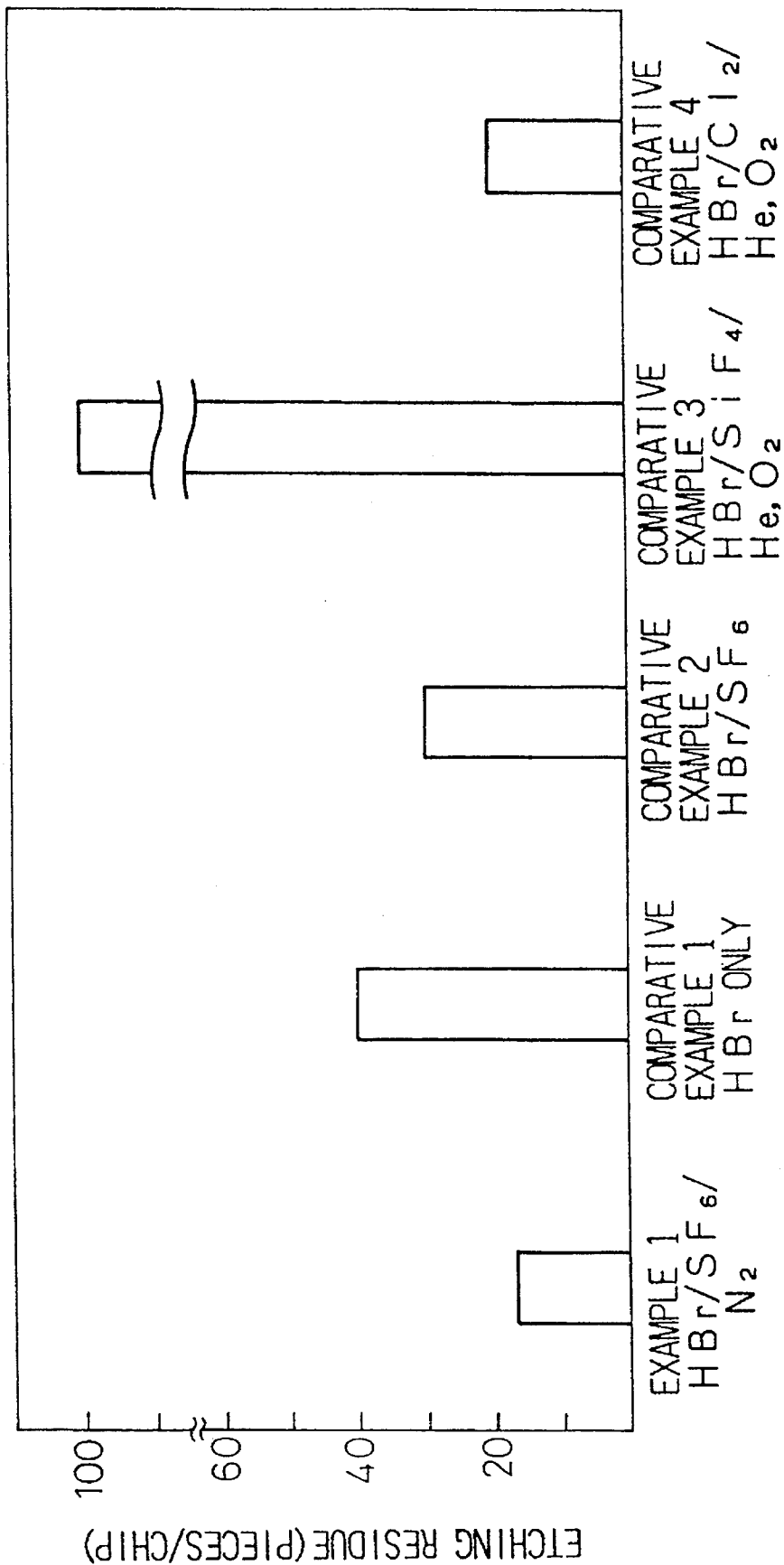
FIG. 9 is a graph showing the amount of etching residue produced by using the etching gas of Example 1 and the Comparative Examples 1 through 4.

Amounts of the etching residue were compared by changing the etching gas of this invention for other gases, resulting as shown in FIG. 9, from which it is apparent that the above embodiment of this invention is most excellent in trench formation. Table 2 b shows the etching conditions of Example 1 and Comparative Examples.

TABLE 2

| Example or Comp. Exam. | Example 1 | Comp. Exam. 1 | Comp. Exam. 2 | Comp. Exam. 3 | Comp. Exam. 4 |
|---|---|---|---|---|---|
| — | HBr/SF$_6$/N$_2$ | HBr only | HBr/SF$_6$ | HBr/SiF$_4$/ He, O$_2$ | HBr/Cl$_2$/ He, O$_2$ |
| HBr Flow Rate (SCCM) | 20 | 80 | 20 | 22 | 30 |
| SiF$_4$ Flow Rate (SCCM) | — | — | — | 5 | — |
| He, O$_2$ Flow Rate (SCCM) | — | — | — | 10 | 4 |
| N$_2$ Flow Rate (SCCM) | 5 | — | — | — | — |
| SF$_6$ Flow Rate (SCCM) | 3 | — | 2 | — | — |
| Cl$_2$ Flow Rate (SCCM) | — | — | — | — | 10 |
| RF Power (W) | 500 | 400 | 400 | 420 | 150 |
| Pressure (mTorr) | 100 | 100 | 100 | 100 | 20 |
| Magnetic Field Strength (Gauss) | 55 | 55 | 55 | 55 | 55 |

TABLE 3

| | Etching Gas | Side Wall Angle | Selectivity against SiO$_2$ | Bowing | Etching Rate (nm/min) | Etching Residue (pieces/chip) |
|---|---|---|---|---|---|---|
| Example 1 | HBr/SF$_6$/ N$_2$ | 87° | 25 | no | 800 | 17 |
| Comp. Exam. 1 | HBr | 88° | 25 | no | 750 | 40 |
| Comp. Exam. 2 | HBr/SF$_6$ | 88° | 25 | no | 800 | 30 |
| Comp. Exam. 3 | HBr/SiF$_4$/ He, O$_2$ | x[1] | 52 | — | 1200 | >100 |
| Comp. Exam. 4 | HBr/Cl$_2$/ He, O$_2$ | 91° | 21 | yes | 350 | 20 |

[1] No etching was attained.

It is apparent that a process is provided wherein etching residue is sharply decreased, side wall angle is well controlled, and trenches are formed with good reproducibility, by the etching gas composition and flow rate control within this invention, as is apparent from Table 3.

The above X system gas may be other than SF$_6$, e.g. CF$_4$, C$_2$F$_6$, CHF$_3$, NF$_3$ etc. and the RIE device may be exchanged for ECR (Electron Cyclotron Resonance) device, which can afford the same effect.

We claim:

1. A process for forming trenches on a surface of a semiconductor substrate by plasma etching of Si using a gas mixture, said gas mixture comprising HBr, SF$_6$ and N$_2$, in a dry etching device, wherein the flow rate of HBr is 10 to 100 SCCM, the flow rate of SF$_6$ is 2 to 10 SCCM, the flow rate of N$_2$ is 3 to 10, under a pressure of the gas mixture of 50 to 150 mTorr, at a high frequency power of the plasma of 200 to 600 watts, and under a magnetic field strength of 0 to 100 gauss.

2. A process according to claim 1, wherein the trench side wall angle is set at an angle of 60 to 90°.

3. A process according to claim 2, wherein the trench side wall angle is made smaller by increasing the flow rate of N$_2$.

4. A process according to claim 2, wherein the trench side wall angle is made smaller by decreasing the flow rate of SF$_6$.

5. A process according to claim 1, wherein during etching, N$_2$ is decomposed to form N radicals in the plasma, which react in the gas phase with Si or etching products to form SiN, which covers the side wall, prevents the progress of excessive etching of the side wall, and controls the side wall angle.

* * * * *